(12) United States Patent
Brobston

(10) Patent No.: US 7,715,810 B2
(45) Date of Patent: May 11, 2010

(54) SYSTEM AND METHOD FOR COMBINING STEPPED DRAIN BIAS CONTROL WITH DIGITAL PREDISTORTION FOR A POWER AMPLIFIER

(75) Inventor: Michael L. Brobston, Allen, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 611 days.

(21) Appl. No.: 11/700,486

(22) Filed: Jan. 31, 2007

(65) Prior Publication Data

US 2008/0180171 A1   Jul. 31, 2008

(51) Int. Cl.
*H04B 1/04* (2006.01)
*H01Q 11/12* (2006.01)

(52) U.S. Cl. ............. 455/114.2; 455/114.3; 455/127.1; 375/297

(58) Field of Classification Search ... 455/114.2–114.3, 455/127.1–127.4; 375/296–297, 312
See application file for complete search history.

(56) References Cited

U.S. PATENT DOCUMENTS

| 6,265,935 | B1 * | 7/2001 | Kaneda et al. | 330/51 |
| 6,794,935 | B2 * | 9/2004 | Klomsdorf et al. | 330/129 |
| 7,197,286 | B2 * | 3/2007 | Ode et al. | 455/114.3 |
| 7,457,617 | B2 * | 11/2008 | Adams et al. | 455/418 |
| 2007/0190952 | A1 * | 8/2007 | Waheed et al. | 455/114.3 |
| 2007/0259628 | A1 * | 11/2007 | Carmel et al. | 455/127.1 |

* cited by examiner

*Primary Examiner*—Simon D Nguyen

(57) ABSTRACT

The present disclosure relates generally to systems and methods for combining stepped drain bias control with digital predistortion for a power amplifier. In one example, the method includes receiving an input associated with a transmit power level of a transmitter in a wireless terminal and selecting a predefined drain bias setting for a power amplifier of the wireless terminal based on the input. A predefined predistortion setting for the power amplifier corresponding to the selected predefined drain bias setting is identified. A drain of the power amplifier is set to the selected predefined drain bias setting, and the identified predefined predistortion setting is applied to a signal prior to directing the signal to the power amplifier.

20 Claims, 3 Drawing Sheets

SYSTEM AND METHOD FOR COMBINING STEPPED DRAIN BIAS CONTROL WITH DIGITAL PREDISTORTION FOR A POWER AMPLIFIER

BACKGROUND

Wireless terminals have a transmit chain for signal transmission. Various components in the transmit chain enable a wireless terminal to control the level of power supplied to the transmitter as well as control other transmission factors. The efficiency of the wireless terminal's transmit chain impacts not only transmission quality but also battery consumption, as providing additional power to the transmit chain negatively impacts battery life. One component of the transmit chain that impacts efficiency is a power amplifier that may be used to alter the amplitude of a signal prior to transmission.

In addressing the problem of wireless terminal power amplifier efficiency, several methods have been proposed for envelope tracking or polar modulation approaches for power amplifier efficiency enhancement combined with predistortion for recovery of the waveform error vector magnitude (EVM). In either of these systems, a bias amplifier that is used to modulate the drain bias of a power amplifier with a voltage that to some degree tracks the envelope of the signal waveform. In this manner, the bias of the power amplifier is reduced when the waveform envelope is relatively small to conserve power dissipation in the power amplifier. When the waveform envelope is relatively large, the power amplifier receives full bias to support amplification of the signal. The power amplifiers in these systems are typically biased to class AB, class D, or class E.

Due to the non-linear response of the power amplifier to modulation of the drain bias, it is normally necessary to combine an envelope tracking or polar modulation transmitter with some form of predistortion in order to meet the EVM requirements at the air interface. However, this approach has limitations when implemented in a wireless terminal. For example, one limitation is that the bandwidth requirement of the amplitude modulation is typically about two to five times that of the waveform bandwidth. Therefore, for narrowband waveforms such as Global System for Mobile communications (GSM) or General Packet Radio Service (GPRS), the amplitude modulator bandwidths are practical, while for wideband waveforms such as Wideband Code Division Multiple Access (WCDMA), 802.11x, or WiMax, the bandwidth requirements on the amplitude modulator can approach thirty to fifty MHz, making the implementation of such circuits impractical.

A second limitation is the efficiency of the amplitude modulator. If a linear regulator type modulator is used, less power is dissipated in the power amplifier as the voltage is reduced to the power amplifier drain, but the additional power is dissipated in the regulator due to the higher voltage drop. The net effect to the battery power drain using a linear regulator type modulator is generally insignificant since the power saved in the power amplifier during low envelope amplitudes is merely dissipated in the regulator.

As such, a switching regulator is often used as the drain bias modulator. Such a regulator can generally maintain an efficiency of eighty percent to ninety percent over a large regulation range. However, for wireless terminal applications, the use of switching regulators can be undesirable due to such factors as the large reactive components that are often required in the circuit, the use of a greater number of components, potential electromagnetic interference (EMI) issues, prohibitive cost of the added circuit components, or spurious problems resulting from the switching noise of the circuit.

There are additional challenges to these approaches related to delays and delay variations between the drain bias modulation and the waveform envelope, dynamic range limitations, and other issues, although these challenges are not documented herein.

Accordingly, an improved system and method for controlling a power amplifier in the transmit chain of a wireless terminal are needed.

SUMMARY

In one embodiment, a method comprises receiving an input associated with a transmit power level of a transmitter in a wireless terminal, selecting a predefined drain bias setting for a power amplifier of the wireless terminal based on the input, and identifying a predefined predistortion setting for the power amplifier corresponding to the selected predefined drain bias setting. A drain bias of the power amplifier is set to the selected predefined drain bias setting and the identified predefined predistortion setting is applied to a signal prior to directing the signal to the power amplifier.

In another embodiment, a method comprises identifying an operational efficiency of a power amplifier of a wireless terminal over a range of transmit power levels and dividing the range of transmit power levels into at least first and second sections. First and second drain bias settings are defined for the first and second sections, respectively, wherein each of the first and second drain bias settings is defined to optimize power usage by the power amplifier when operating in a range of transmit power levels included in the first and second sections, respectively. First and second predistortion settings are defined for the first and second drain bias settings, respectively, wherein the first and second predistortion settings are defined to linearize the power amplifier's operation when the power amplifier is operating at the first and second drain bias settings, respectively. The first and second drain bias settings are linked to the first and second sections, respectively.

In still another embodiment, a wireless terminal circuit comprises a controller, predistortion circuitry coupled to the controller, and a power amplifier having an input coupled to an output of the predistortion circuitry. The circuit further includes a drain bias controller coupled to the controller and the power amplifier, wherein an output of the drain bias controller is coupled to a drain of the power amplifier. The circuit also includes a memory coupled to the controller and predistortion circuitry, wherein the memory contains a plurality of drain bias settings for use with the drain bias controller linked to a plurality of predistortion settings for use with the predistortion circuitry.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
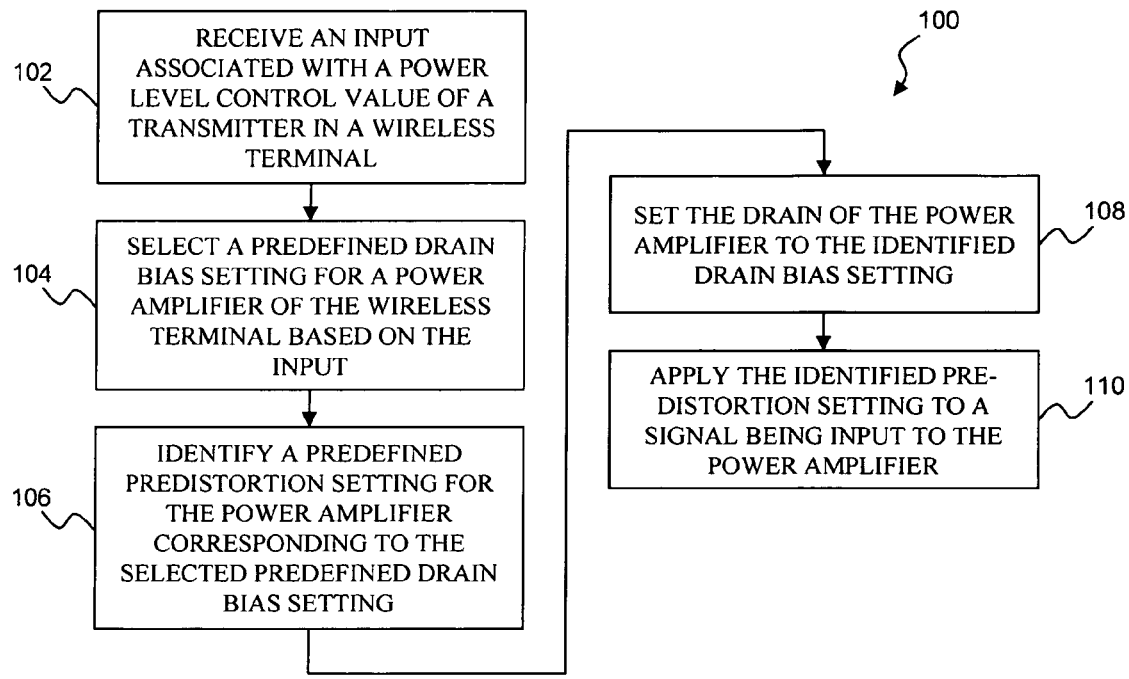
FIG. 1 is a flowchart illustrating one embodiment of a method for stepped drain bias control and pre-distortion for a power amplifier in a wireless terminal.

It is to be understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, in one embodiment, a method 100 may be used in a wireless terminal to combine stepped bias control and digital predistortion to a power amplifier. One example of a circuit with which the method 100 may be used is described below with reference to FIG. 2. The term "wireless terminal" as used herein refers to any device that may transmit, process, and receive wireless signals, and may include mobile telephones, computers, personals digital assistants, and pagers, as well as base stations, access points, and other network infrastructure.

The method 100 introduces an approach that avoids the issues related with envelope tracking systems while still taking advantage of power amplifier bias control as a loosely coupled function of waveform amplitude. Rather than forcing the drain bias modulator to track the envelope of the waveform, the method 100 relies on a stepped setting of the drain bias voltage that is determined by, for example, the reverse link power control of the wireless terminal. In this approach, the wireless terminal would set the drain bias voltage to the power amplifier to one of several possible fixed voltages based on the targeted transmit power of the wireless terminal. For example, for the maximum transmit power setting, the drain bias voltage would be set to a voltage defined in a BIAS1 setting. For transmit power settings that are below maximum, such as between 6 dB to 3 dB below maximum, the drain bias voltage would be set to the voltage defined in a BIAS2 setting. Continuing with this example, for transmit power settings that are 10 dB to 6 dB below maximum, the drain bias voltage would be set to a voltage defined in a BIAS3 setting. It is understood that the number of bias voltage settings and the corresponding transmit power ranges are not fixed, but are provided for purposes of example. The number of different bias conditions could be as low as two or could be whatever number is optimal to achieve a desired balance between power control robustness and transmitter efficiency.

Another aspect of the approach introduced by method 100 is to combine digital predistortion with the variable drain voltage setting. For each discrete bias condition (BIAS1, BIAS2, BIAS3, etc), a signal processor or other controller of the wireless terminal may maintain and update a unique predistortion look-up table (LUT). For example, for the BIAS1 condition, the signal processor in the wireless terminal may maintain and update predistortion LUT PD1. For the BIAS2 condition, the signal processor may maintain and update predistortion LUT PD2. For each bias condition, the power amplifier will have a unique set of linearity characteristics. Accordingly, the predistortion LUTs basically contain the inverse amplitude-to-amplitude (AM/AM) and amplitude-to-phase (AM/PM) characteristics of the power amplifier for the specific bias condition.

In operation, an input is received that is associated with a power level control value of a transmitter of the wireless terminal in step 102. For example, the input may be obtained from a reverse link power level control value received by a receiver of the wireless terminal. In step 104, the input is used to select a predefined drain bias setting (BIAS1, BIAS2, etc.) and, in step 106, a predistortion setting that corresponds to the selected predefined drain bias setting is identified. For example, as will be described below in greater detail, the input may be used as an index value to reference one or more lookup tables or other memory structures to retrieve the drain bias and predistortion settings. The drain bias setting and predistortion settings may be linked so that looking up one automatically looks up the other, or they may be looked up separately. In step 108, the drain of the power amplifier is biased using the voltage defined in the drain bias setting and, in step 110, the predistortion setting is applied to a signal that is to be input to the power amplifier. Accordingly, the output of the power amplifier may be controlled using a known relationship between the input received in step 102 and the drain bias and predistortion settings for a given transmit power level.

Figure 2:
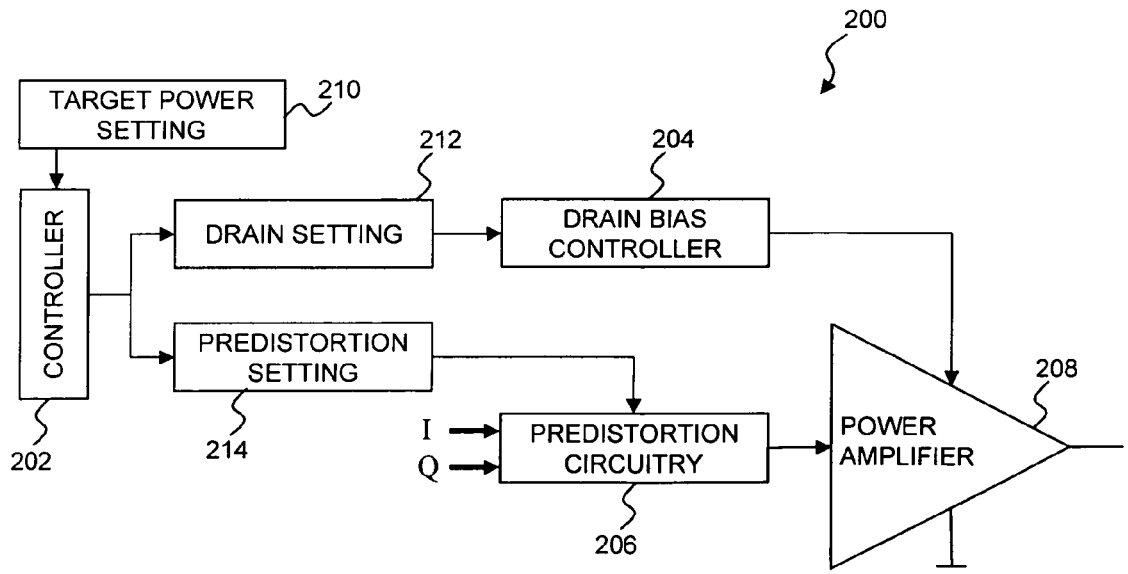
FIG. 2 is a block diagram of one embodiment of a circuit of a wireless terminal that may be implemented to provide stepped drain bias control and pre-distortion for a power amplifier.

Referring to FIG. 2, one embodiment of a circuit 200 is illustrated. The circuit 200 is a control circuit that may be used to set the drain voltage to a power amplifier and to modify a signal based on various predistortion characteristics. To preserve efficiency in the wireless terminal, the circuit 300 may be a multi-level switching regulator that can be controlled to output various bias voltages to a power amplifier drain circuit.

In the present example, the circuit 200 includes a controller 202, a drain bias controller 204, predistortion circuitry 206, and a power amplifier 208. It is understood that each of the components described herein may include various circuit components that are not shown for purposes of clarity. The controller 202 may be a main controller for the wireless terminal, may be a digital signal processor (DSP) having other functions in the transmit and/or receive chains of the wireless terminal, or may be a dedicated processor for the circuit 200.

In operation, a target power setting 210 is received by the controller 202, which uses the setting to identify a drain setting 212 and predistortion setting 214. The drain setting 212 is input to the drain bias controller 204, which in turn sets the drain of the power amplifier 208 based on the drain setting. The predistortion setting 214 is input to the predistortion circuitry 206, which applies the predistortion setting to I and Q path signals before inputting the signals to the power amplifier 208. Although not shown, the output of the power amplifier 208 may feed back into the controller 202 and/or predistortion circuitry 206. One or more memories (not shown) may store the drain setting 212 and predistortion setting 214.

Figure 3:
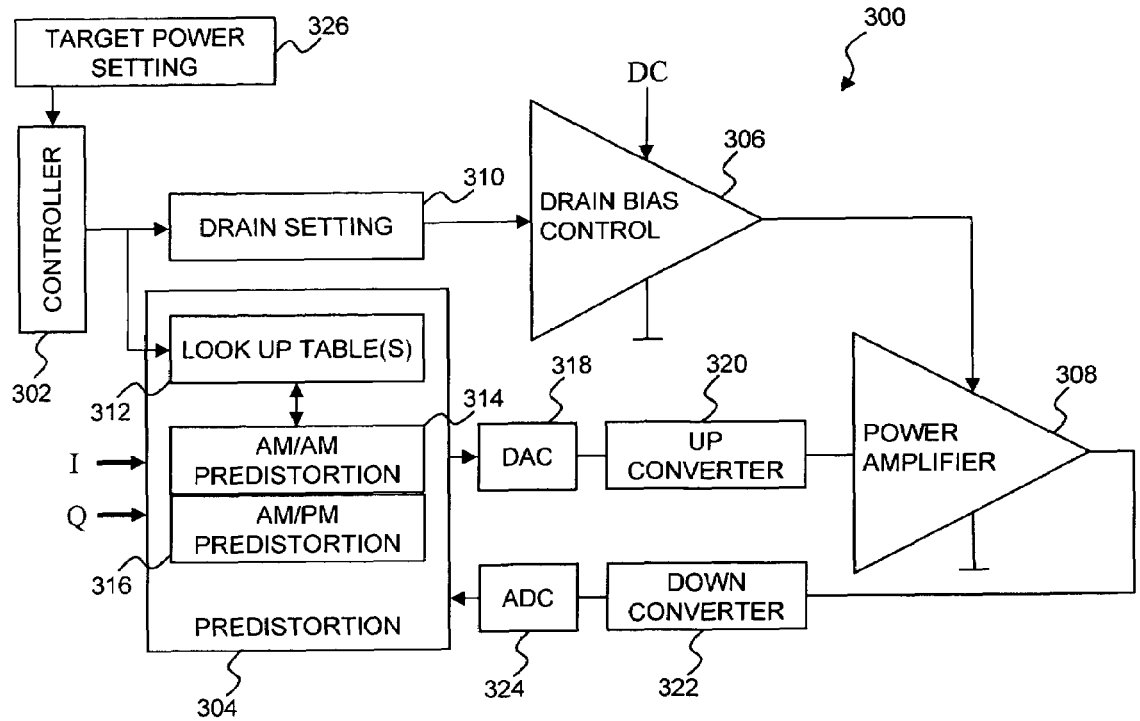
FIG. 3 is a block diagram of a more detailed embodiment of the circuit of FIG. 2.

Referring to FIG. 3, a circuit 300 illustrates a more detailed embodiment of the circuit 200 of FIG. 2. The circuit 300 is a drain bias control circuit that sets the drain voltage to a power amplifier. To preserve efficiency in the wireless terminal, the circuit 300 is a multi-level switching regulator that can be controlled to output various bias voltages to the power amplifier drain circuit. Being a switching regulator, the conversion efficiency is expected to be in the eighty percent to ninety percent range. Since the circuit 300 is switched between various bias voltage states as a function of the target transmit power driven by a reverse power control loop, it does not need to support the bandwidth required to track the envelope of the signal waveform. This greatly reduces the complexity of the circuit 300.

In the present example, the circuit 300 includes a controller 302, a digital predistortion block 304, a drain bias control amplifier 306, and a power amplifier 308. One or more drain settings 310 may be included in the predistortion block 304 or may be separate (as shown). The predistortion block 304 includes one or more lookup tables (LUTs) 312, and AM/AM predistortion circuitry 314 and AM/PM predistortion circuitry 316 for modifying incoming I and Q path signals based on stored AM/AM and AM/PM characteristics.

The controller 302 may be a main controller for the wireless terminal, may be a digital signal processor (DSP) having other functions in the transmit and/or receive chains of the wireless terminal, or may be a dedicated processor for the bias control circuit 300.

The digital predistortion block 304 may be implemented in field programmable gate array (FPGA) or application specific integrated circuit (ASIC) logic, and/or using a digital signal processor (DSP). Within digital predistortion block 304, the various predistortion LUTs 312 are maintained and updated. As the target transmit power level is changed, the digital predistortion block 304 targets the appropriate LUT to determine the required AM/AM and AM/PM compensation plus memory effect compensation required to linearize the power amplifier 308 corresponding to a specific bias condition.

The drain bias control amplifier 306 receives the drain setting 310 as an input. The output of the drain bias control amplifier 306 sets the voltage of the drain of the power amplifier 308. A digital-to-analog converter (DAC) 318 receives the predistorted signal from the predistortion circuitry 314/316 and, after converting the signal from a digital signal to an analog signal, passes the signal to an up converter 320. The output of the up converter 320 is input to the power amplifier 308, and the output of the power amplifier is passed to a down converter 322. It is understood that a portion of the signal output by the power amplifier 308 may be passed to the down converter 322, while a remainder of the signal may be transmitted or passed to other circuitry in the transmit chain for further processing or transmission. The down converter 322 down converts the feedback signal to baseband and passes the signal to an analog-to-digital converter (ADC) 324, which provides the digitized signal to the predistortion portion 304 for feedback.

In operation, a target power setting 326 is input to the controller 302, which uses the setting to identify the drain setting 310 and to access lookup tables 312 to select AM/AM and AM/PM predistortion settings for predistortion circuitry 314/316. Drain bias control amplifier 306 sets the drain bias of the power amplifier 308, and I and Q path signals are predistorted and fed into the power amplifier after passing through DAC 318 and up converter 320. Feedback into predistortion block 304 may be provided from the output of power amplifier 308. It is understood that functionality provided by various components of the circuit 300 may be implemented in hardware and/or software. Furthermore, various other circuit components (not shown) may be implemented in the circuit 300.

Figure 4:
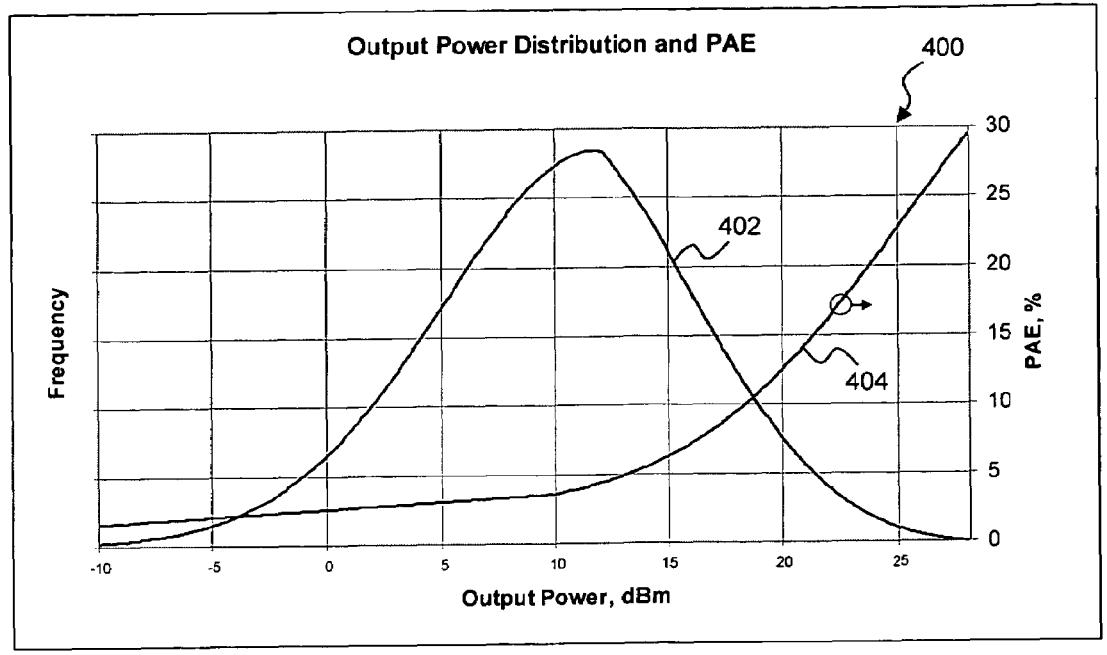
FIG. 4 is a graph illustrating power amplifier efficiency through a range of output power levels for one embodiment of a power amplifier.
Figure 5:
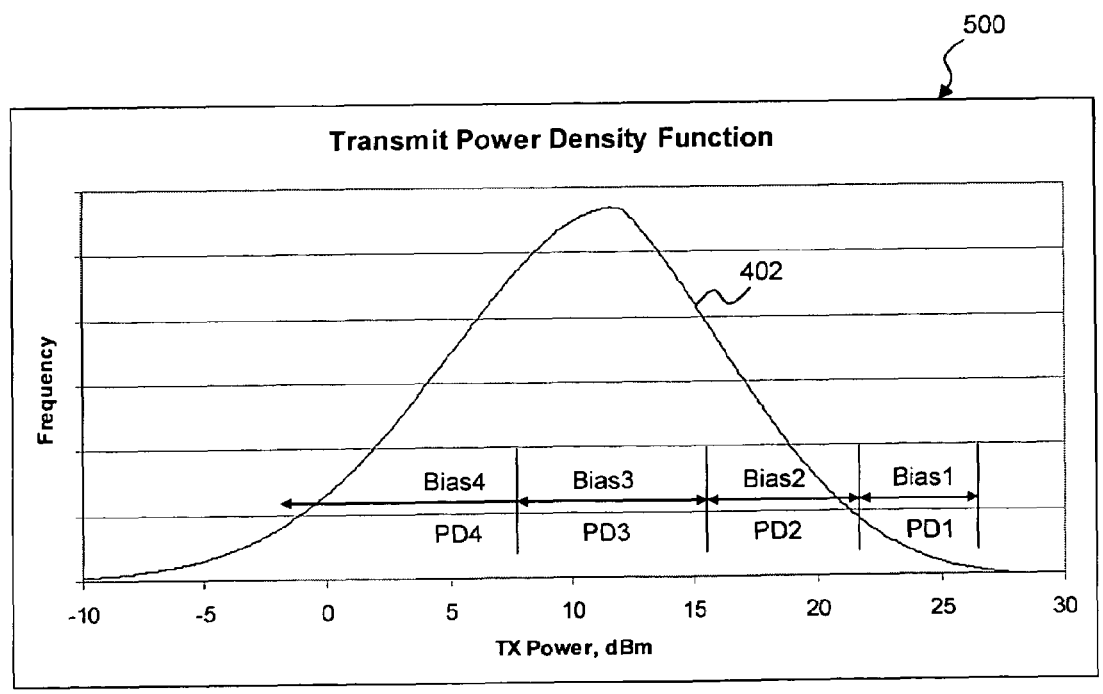
FIG. 5 is a graph illustrating one embodiment of the assignment of drain bias settings and predistortion settings to a range of transmit power levels.

Referring to FIGS. 4 and 5, graphs 400 and 500 illustrate a typical power distribution probability function of a wireless terminal's power amplifier, such as the power amplifier 308 of FIG. 3. For purposes of example, +28 dBm is considered the maximum transmitter power in graphs 400 and 500.

With specific reference to FIG. 4, graph 400 includes a curve 402 illustrating a distribution of the operating power level of the exemplary power amplifier 308 in dBm. A curve 404 illustrates the percentage efficiency of the power amplifier 308 over its operational range. As illustrated by curve 402, the power amplifier 308 only operates at the maximum level (e.g., +28 dBm) for a very small percentage of the time. Most of the time the transmitter is in operation, the power amplifier 308 is operating at much lower power levels than the maximum. Accordingly, if the drain bias of the power amplifier 308 is fixed at a level high enough to support the maximum transmit power, then the efficiency of the power amplifier for most operating conditions is very poor.

For example, if the power control loop sets the wireless terminal's transmitter power to operate at +10 dBm, but the power amplifier 308 is biased to operate at any level up to +28 dBm, the efficiency of the power amplifier is very low. Therefore, the wireless terminal's battery power will be drained at a rate that is unnecessarily high during a period in which it could be reduced. In the example provided by FIG. 4, while most of the power amplifier's operation is within the 0 to +15 dBm range, the average efficiency (PAE) within this range is only four to five percent.

With specific reference to FIG. 5, a graph 500 includes the curve 402 of FIG. 4 and an associated set of bias setting (BIAS1-BIAS4) and predistortion settings (PD1-PD4). The stepped drain bias approach described with respect to the method 100 of FIG. 1 defines certain ranges of transmit power over which the drain bias is set to a specific level. In the example provided by FIG. 5, BIAS1/PD1 are associated with a transmit power range of approximately 22 dBm-maximum, BIAS2/PD2 are associated with a transmit power range of approximately 15.5 dBm-22 dBm, BIAS3/PD3 are associated with a transmit power range of approximately 7.5 dBm-15.5 dBm, and BIAS4/PD4 are associated with a transmit power range of approximately minimum-7.5 dBm. It is understood that the association of the particular transmit power ranges with bias condition ranges and corresponding predistortion ranges as shown with respect to FIG. 5 is for purposes of example only.

The use of predefined drain bias and predistortion settings for particular ranges of output power levels allows the efficiency of the power amplifier 308 to be optimized to the target transmitter power level, which reduces the battery drain and extends the charge life of the battery. This allows the power amplifier 308 to be operated and biased at a point that provides optimal efficiency for any transmit power level. Operating the power amplifier 308 most efficiently means operating the power amplifier with the minimum output back-off (OBO) for each target output power. Therefore, the power amplifier 308 would have degraded linearity at the lower power settings similar to what the typical power amplifier has when operated at its maximum rated output power. By setting up a unique predistortion LUT for each bias condition, the wireless transmitter is able to linearize the power amplifier 308 that is set to operate at minimum OBO for the target output power. Using this method, the power amplifier efficiency and linearity may be optimized to significantly reduce the battery drain while maintaining or improving the EVM.

Figure 6:
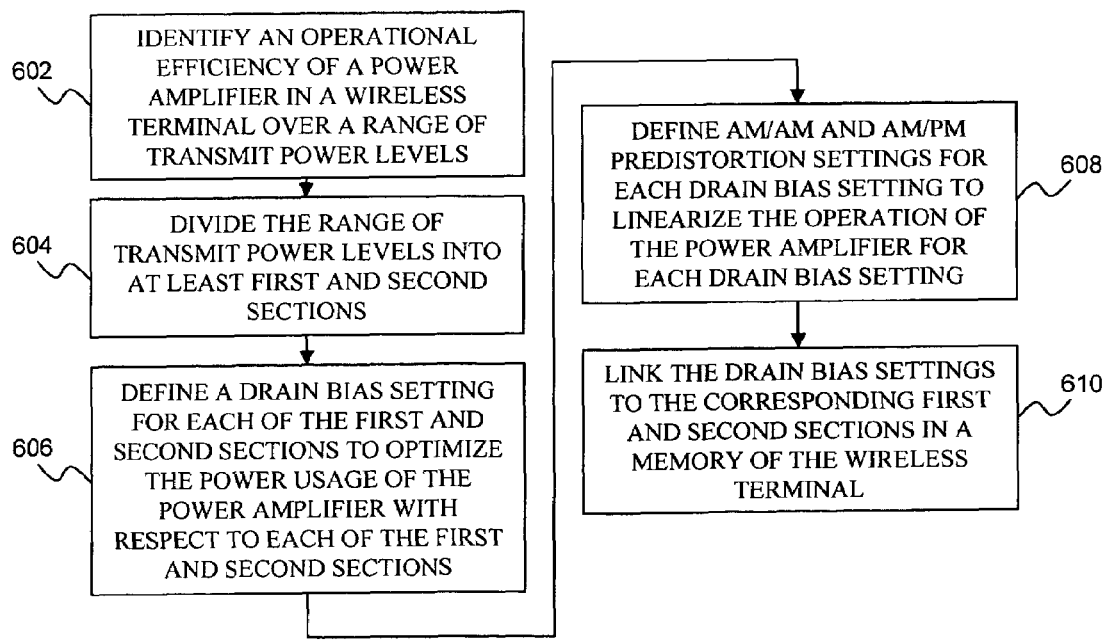
FIG. 6 is a flowchart illustrating one embodiment of a method for defining drain bias settings and predistortion settings for a power amplifier in a wireless terminal.

Referring to FIG. 6, in another embodiment, a method 600 illustrates the selection of drain bias and predistortion values for a power amplifier of a wireless terminal, such as the power amplifier 308 of FIG. 3.

In step 602, an operational efficiency of the power amplifier 308 is identified over a range of transmit power levels. For example, in the illustration provided with respect to FIG. 4, the range of transmit power levels would have a maximum of value of +28 dBm. The efficiency of the power amplifier 308, as illustrated by curve 404 of FIG. 4, may be used to identify the power amplifier's efficiency relative to a typical distribution of transmit power, as illustrated by curve 402. As described previously, the example of FIG. 4 illustrates that the power amplifier 308 generally uses an output power of between approximately 5 and 17 dBm, although it operates most efficiently at its maximum.

In step 604, the identified range of transmit power levels is divided into at least two sections. Continuing the example of FIGS. 4 and 5, the transmit power levels are divided into four sections covering ranges of approximately 22 dBm-maximum, 15.5 dBm-22 dBm, 7.5 dBm-15.5 dBm, and minimum-7.5 dBm. These sections may be selected based on many different criteria, but the general goal of the present example is to divide the output power level range into sections where a drain bias setting may be defined that will provide a desired level of efficiency for that particular dBm range. Dividing the transmit power level range into too few sections may result in undesired inefficiencies as there will not be enough drain bias settings to adequately address the configuration needs of the power amplifier 308, while too many sections may result in inefficiencies from too much switching.

In step 606, a drain bias setting is defined for each of the sections. Again referring to the example of FIG. 5, BIAS1 is assigned to the section representing approximately 22 dBm-maximum, BIAS2 is assigned to the section representing approximately 15.5 dBm-22 dBm, BIAS3 is assigned to the section representing approximately 7.5 dB-15.5 dBm, and BIAS1 is assigned to the section representing approximately minimum-7.5 dBm.

In step 608, predistortion settings are defined for each of the drain bias settings. Continuing the example of FIG. 5, predistortion setting PD1 is assigned to BIAS1, PD2 is assigned to BIAS2, PD3 is assigned to BIAS3, and PD4 is assigned to BIAS4. It is understood that each predistortion setting PD1-PD4 may include both AM/AM and AM/PM characteristics to linearize the operation of the power amplifier for each of the corresponding drain bias settings. The predistortion LUTs PD1-PD4 can be either fixed or adapted to compensate for power amplifier circuit variations with time and temperature. If fixed, the LUTs may be loaded into memory during terminal manufacturing or programming and may not be altered after that. In this case, no feedback of the power amplifier output to the predistortion block would be needed. If adaptive, the downconverted and digitally sampled feedback signal of the power amplifier output may be compared in the predistortion block to the input baseband I and Q data. This comparison may be used to identify the resultant errors of that specific predistortion setting. The PD LUT may then be updated to minimize the errors either during an inter-burst period or later when that specific LUT is not in use. In this manner, each of the PD LUTs may be periodically updated to adapt to the changing AM/AM, AM/PM, or memory characteristics of the power amplifier or other related portions of the hardware circuitry.

In step 610, the method 600 may link the drain bias settings to their corresponding sections of the transmit power range levels. This enables the output of the power amplifier 308 to be controlled by selecting the appropriate drain bias setting and associated predistortion setting based on the transmit power level, as described previously.

Although only a few exemplary embodiments of this disclosure have been described in details above, those skilled in the art will readily appreciate that many modifications are possible in the exemplary embodiments without materially departing from the novel teachings and advantages of this disclosure. Also, features illustrated and discussed above with respect to some embodiments can be combined with features illustrated and discussed above with respect to other embodiments. Accordingly, all such modifications are intended to be included within the scope of this disclosure.

What is claimed is:

1. A method comprising:
receiving an input associated with a transmit power level of a transmitter in a wireless terminal;
selecting one of a plurality of drain bias settings for a power amplifier of the wireless terminal based on the input;
identifying a predistortion setting for the power amplifier corresponding to the selected drain bias setting, the selected drain bias setting corresponding to a unique set of predistortion settings;
setting a drain voltage of the power amplifier based on the selected drain bias setting; and
applying the identified predistortion setting to a signal prior to directing the signal to the power amplifier.

2. The method of claim 1 wherein the plurality of drain bias settings is redefined.

3. The method of claim 1 further comprising identifying a range of transmit power levels within which the input belongs, wherein the drain bias setting to be selected corresponds to the identified range.

4. The method of claim 1 wherein identifying the predistortion setting includes accessing a lookup table containing the unique set of predistortion settings using the input as an index.

5. The method of claim 4 wherein the unique set of predistortion settings includes inverse amplitude-to-amplitude (AM/AM) and amplitude-to-phase (AM/PM) characteristics of the power amplifier.

6. The method of claim 1 wherein receiving the input includes obtaining a reverse link power level control value from a receiver of the wireless terminal.

7. The method of claim 1 wherein selecting the drain bias setting automatically identifies the predistortion setting.

8. The method of claim 1 further comprising using an output of the power amplifier as feedback for modifying at least one of the drain bias setting and the predistortion setting.

9. A method comprising:
identifying an operational efficiency of a power amplifier of a wireless terminal over a range of transmit power levels;
dividing the range of transmit power levels into at least first and second sections;
defining first and second drain bias settings for the first and second sections, respectively, wherein each of the first and second drain bias settings is defined to optimize power usage by the power amplifier when operating in a range of transmit power levels included in the first and second sections, respectively;
defining first and second sets of predistortion settings for the first and second drain bias settings, respectively, wherein the first and second sets of predistortion settings are defined to linearize the power amplifier's operation when the power amplifier is operating at the first and second drain bias settings, respectively; and
linking the first and second sets of predistortion settings to the first and second sections respectively, each of the first and second sets of predistortion settings being unique.

10. The method of claim 9 wherein defining the first and second sets of predistortion settings includes defining inverse amplitude-to-amplitude (AM/AM) and amplitude-to-phase (AM/PM) characteristics for each of the first and second drain bias settings, respectively.

11. The method of claim 9 wherein linking the first and second drain bias settings to the first and second sets of predistortion settings includes storing the first and second sets of predistortion settings in first and second lookup tables.

12. The method of claim 11 wherein the lookup tables are indexed by an input.

13. The method of claim 12 wherein the input is a power level control value associated with a transmitter of the wireless terminal.

14. The method of claim 13 wherein the power level control value is a reverse link power level control value received by the wireless terminal.

15. A wireless terminal circuit comprising:
a controller;
predistortion circuitry coupled to the controller;
a power amplifier having an input coupled to an output of the predistortion circuitry;
a drain bias controller coupled to the controller and the power amplifier, wherein an output of the drain bias controller is coupled to a drain of the power amplifier; and
a memory coupled to the controller, predistortion circuitry, and drain bias controller, wherein the memory contains a plurality of drain bias settings for use with the drain bias controller, each of the drain bias settings linked to a unique set of predistortion settings for use with the predistortion circuitry.

16. The wireless terminal circuit of claim 15 wherein the unique set of predistortion settings is stored in a lookup table in the memory.

17. The wireless terminal circuit of claim 15 further comprising a digital-to-analog converter and an up converter positioned in a signal path leading from the output of the predistortion circuitry to the input of the power amplifier.

18. The wireless terminal circuit of claim 17 further comprising an analog-to-digital converter and a down converter positioned in a signal path leading from an output of the power amplifier to an input of the predistortion circuitry.

19. The wireless terminal circuit of claim 15 wherein the drain bias controller is an amplifier.

20. The wireless terminal of claim 15 wherein at least a portion of the memory is part of the predistortion circuitry.

* * * * *

UNITED STATES PATENT AND TRADEMARK OFFICE
CERTIFICATE OF CORRECTION

| | | |
|---|---|---|
| PATENT NO. | : 7,715,810 B2 | Page 1 of 1 |
| APPLICATION NO. | : 11/700486 | |
| DATED | : May 11, 2010 | |
| INVENTOR(S) | : Michael L. Brobston | |

It is certified that error appears in the above-identified patent and that said Letters Patent is hereby corrected as shown below:

Column 8, claim 2, line 23, delete "redefined" and replace with --predefined--.

Signed and Sealed this
Fourth Day of January, 2011

David J. Kappos
*Director of the United States Patent and Trademark Office*